(12) United States Patent
Carcia

(10) Patent No.: US 10,989,765 B2
(45) Date of Patent: Apr. 27, 2021

(54) WIRE CONNECTION QUALITY MONITORING SYSTEMS

(71) Applicant: Hamilton Sundstrand Corporation, Charlotte, NC (US)

(72) Inventor: Francis A. Carcia, Enfield, CT (US)

(73) Assignee: Hamilton Sundstrand Corporation, Charlotte, NC (US)

(*) Notice: Subject to any disclaimer, the term of this patent is extended or adjusted under 35 U.S.C. 154(b) by 41 days.

(21) Appl. No.: 16/446,128

(22) Filed: Jun. 19, 2019

(65) Prior Publication Data

US 2020/0400733 A1    Dec. 24, 2020

(51) Int. Cl.
*G01R 31/66* (2020.01)
*B64F 5/60* (2017.01)
*G01R 27/20* (2006.01)
*G01R 31/00* (2006.01)

(52) U.S. Cl.
CPC ............ *G01R 31/66* (2020.01); *B64F 5/60* (2017.01); *G01R 27/205* (2013.01); *G01R 31/008* (2013.01)

(58) Field of Classification Search
CPC .... G01R 31/66; G01R 27/205; G01R 31/008; B64F 5/60
USPC ........................................................ 324/538
See application file for complete search history.

(56) References Cited

U.S. PATENT DOCUMENTS

| | | | |
|---|---|---|---|
| 8,928,339 B2 | 1/2015 | Bommer et al. | |
| 9,128,119 B2* | 9/2015 | Said | G01R 31/1227 |
| 10,067,175 B2 | 9/2018 | Ramirez et al. | |
| 2007/0199386 A1* | 8/2007 | Kuroda | G01R 31/2817 73/774 |
| 2008/0246491 A1* | 10/2008 | Ogawa | G01R 31/2853 324/519 |
| 2019/0120889 A1* | 4/2019 | Carcia | G01R 31/52 |

FOREIGN PATENT DOCUMENTS

| | | |
|---|---|---|
| DE | 10347038 A1 | 5/2005 |
| EP | 2887555 A1 | 6/2015 |

OTHER PUBLICATIONS

EPO App. No. 19210753 Form 1507N (Jul. 10, 2020), as provided by Applicant. (Year: 2020).*
Extended European Search Report dated Jul. 10, 2020, issued during the prosecution of European Patent Application No. EP 19210753.0.

* cited by examiner

*Primary Examiner* — Tung X Nguyen
*Assistant Examiner* — Robert P Alejnikov, Jr.
(74) *Attorney, Agent, or Firm* — Locke Lord LLP; Daniel J. Fiorello; Scott D. Wofsy

(57) ABSTRACT

A connection quality system can include a resistance test module, a first line connected to the resistance test module and configured to connect to a wire connection assembly past one or more physical connections of the wire connection assembly, and a second line connected to the resistance test module and configured to connect to the wire connection assembly directly or indirectly on an opposite side of the one or more physical connections of the wire connection assembly such that the first line and the second line are in electrical communication through the wire connection assembly. The resistance test module can be configured to determine if the one or more physical connections are degraded or broken based on a resistance of the wire connection assembly.

9 Claims, 4 Drawing Sheets

WIRE CONNECTION QUALITY MONITORING SYSTEMS

BACKGROUND

1. Field

This disclosure relates to connection quality monitoring, e.g., of shielded wire connections.

2. Description of Related Art

Certain systems, e.g., aircraft systems include wires that have multiple connection joints. Currently, to ensure that these connections are not damaged nor overly degraded to maintain safe functionality, these wires and connections must be subjected to manual bond resistance testing inspection cycles for degraded bond testing. This is labor intensive and time consuming.

Such conventional methods and systems have generally been considered satisfactory for their intended purpose. However, there is still a need in the art for improved connection quality monitoring systems. The present disclosure provides a solution for this need.

SUMMARY

In accordance with at least one aspect of this disclosure, a connection quality system can include a resistance test module, a first line connected to the resistance test module and configured to connect to a wire connection assembly past one or more physical connections of the wire connection assembly, and a second line connected to the resistance test module and configured to connect to the wire connection assembly directly or indirectly on an opposite side of the one or more physical connections of the wire connection assembly such that the first line and the second line are in electrical communication through the wire connection assembly. The resistance test module can be configured to determine if the one or more physical connections are degraded or broken based on a resistance of the wire connection assembly.

The resistance test module, the first line, and the second line can be configured to form a Wheatstone bridge with the wire connection assembly. For example, the resistance test module can include at least three resistors of the Wheatstone bridge, each having a predetermined resistance. The resistance test module can be configured to connect to the wire connection assembly to cause the wire connection assembly to act as a variable fourth resistor of the Wheatstone bridge.

In certain embodiments, the at least three resistors of the resistance test module can include a first resistor, a second resistor, a third resistor, and a fifth resistor. The first resistor and the second resistor can be connected in parallel to a voltage source. The fifth resistor can be connected to a first test point between the second resistor and the first line such that the first test point is between the second resistor and the wire connection assembly acting as the fourth resistor. The fifth resistor can be connected to a second test point between the first resistor and the third resistor. In certain embodiments, the third resistor (e.g., via the second line) and the fourth resistor can be connected in parallel to ground (e.g., to a common ground).

In certain embodiments, the fifth resistor can be connected to the first test point remotely on the wire connection assembly via a remote sense line. In such a case, the first test point is still between the second resistor and the wire connection assembly acting as the fourth resistor of the Wheatstone bridge. The fifth resistor and the other resistors can be connected similarly as described above.

The resistance test module can include a control module configured to determine a voltage drop across the fifth resistor between the first test point and the second test point. The voltage drop over the fifth resistor can be a function of the resistance value of the wire connection assembly, and thus resistance can be determined, directly or indirectly, as a function of voltage drop across the fifth resistor.

In certain embodiments, the system can include the wire connection assembly. The one or more physical connections include at least one of a shield termination connection between a shield and a back shell, a back shell connection between a first mating connector and the back shell, a mating connection between a first mating connector and a second mating connector, or a chassis connection between a connector flange and a chassis. Any other suitable physical connections and/or wire connection assemblies are contemplated herein.

In certain embodiments, a return path is via only the wire connection assembly in electrical communication with the second line and/or a common ground with the second line. In certain embodiments, a return path can be via a separate return line connected to a remote end of the wire connection assembly. The separate return line can be in electrical communication with the second line and/or a common ground with the second line.

In accordance with at least one aspect of this disclosure, a system for an aircraft can include a wire connection assembly, and an integrated resistance test module connected to the wire connection assembly and configured to form a Wheatstone bridge with the wire connection assembly. The resistance test module can be configured to determine a quality of the wire connection assembly and/or one or more physical connections thereof.

In accordance with at least one aspect of this disclosure, a method can include using a wire connection assembly as a variable fourth resistor of a Wheatstone bridge to determine a state of one or more physical connections of the wire connection assembly. Using the wire connection assembly can include passing a current through the wire connection assembly to determine a voltage drop over a bridge resistor of the Wheatstone bridge to measure a resistance of the wire connection assembly.

The method can include monitoring the voltage drop in situ to determine if the state of the one or more physical connections of the wire connection assembly are damaged or degraded a predetermined amount. The method can include activating an alert if the voltage drop and/or resistance value reaches or exceeds a predetermined threshold. The predetermined threshold can be a fixed resistance value higher than a normal resistance value for the wire connection assembly, for example.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1A:
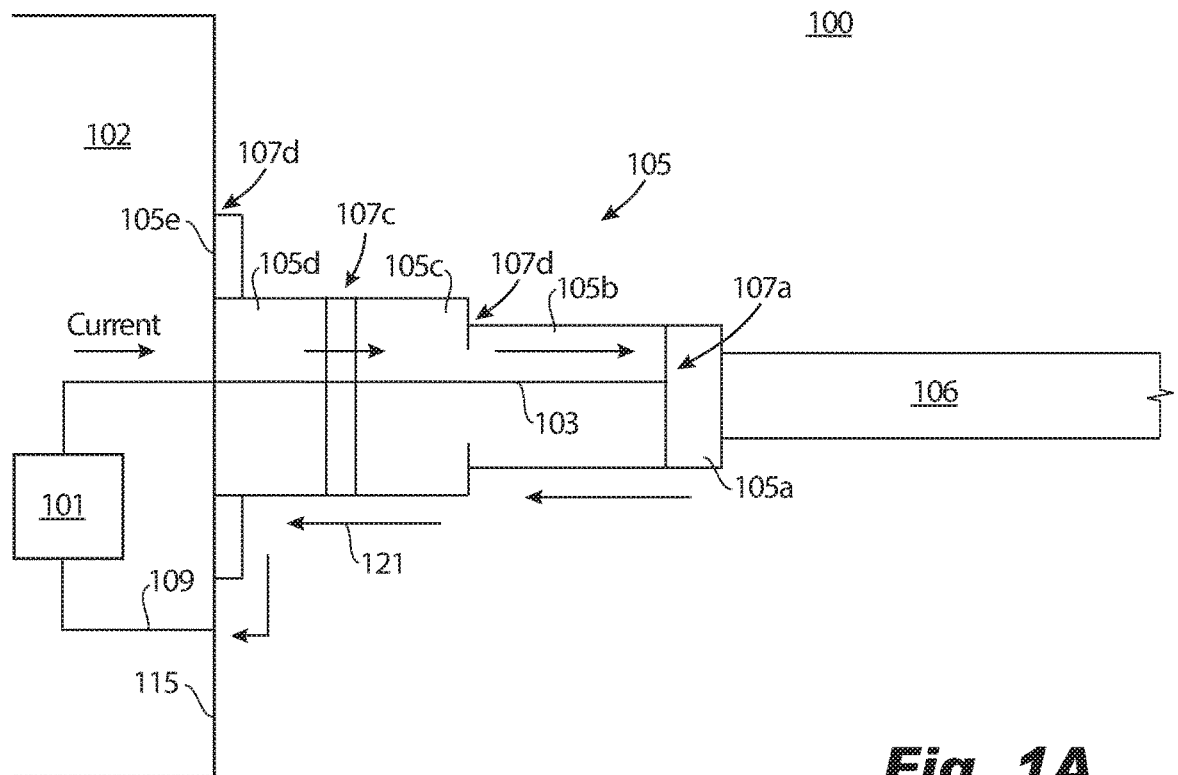
FIG. 1A is a schematic diagram of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1A and is designated generally by reference character 100. Other embodiments and/or aspects of this disclosure are shown in FIGS. 1B-3. Certain embodiments described herein can be used to monitor wire connection quality of one or more physical connections of a wire connection assembly in situ.

Referring to FIGS. 1A-1D, a connection quality system 100 can include a resistance test module 101, a first line 103 connected to the resistance test module 101 and configured to connect to a wire connection assembly 105 past one or more physical connections 107a, b, c, d of the wire connection assembly 105. The system 100 can include a second line 109 connected to the resistance test module 101 and configured to connect to the wire connection assembly 105 directly or indirectly on an opposite side of the one or more physical connections 107a, b, c, d of the wire connection assembly 105 such that the first line 103 and the second line 109 are in electrical communication (e.g., to a common ground) through the wire connection assembly 105. The resistance test module 101 can be configured to determine if the one or more physical connections 107a, b, c, d are degraded or broken based on a resistance of the wire connection assembly 105.

The resistance test module 101, the first line 103, and the second line 109 can be configured to form a Wheatstone bridge (e.g., as shown and/or as appreciated by those having ordinary skill in the art of Wheatstone bridges) with the wire connection assembly 105. For example, the resistance test module 101 can include at least three resistors 101a, 101b, 101c of the Wheatstone bridge, each having a predetermined resistance (e.g., fixed resistances R1, R2, and R3, respectively). The resistance test module 101 can be configured to connect to the wire connection assembly 105 to cause the wire connection assembly 105 to act as a variable fourth resistor 101d of the Wheatstone bridge (e.g., having a variable resistance R4 depending on the state of the wire connection assembly 105).

In certain embodiments, the at least three resistors of the resistance test module 101 can include a first resistor 101a, a second resistor 101b, a third resistor 101c, and a fifth resistor 101e (e.g., a reference load). As shown, the first resistor 101a and the second resistor 101b can be connected in parallel to a voltage source 111. The fifth resistor 101e can be connected to a first test point 113a between the second resistor 101b and the first line 103 such that the first test point 113a is between the second resistor 101b and the wire connection assembly 105 acting as the fourth resistor 101d of the Wheatstone bridge. The fifth resistor 101e can be connected to a second test point 113b between the first resistor 101a and the third resistor 101c. In certain embodiments, the third resistor 101c (e.g., via the second line 109) and the fourth resistor 101d can be connected in parallel to ground 115 (e.g., to a common ground).

Figure 2A:
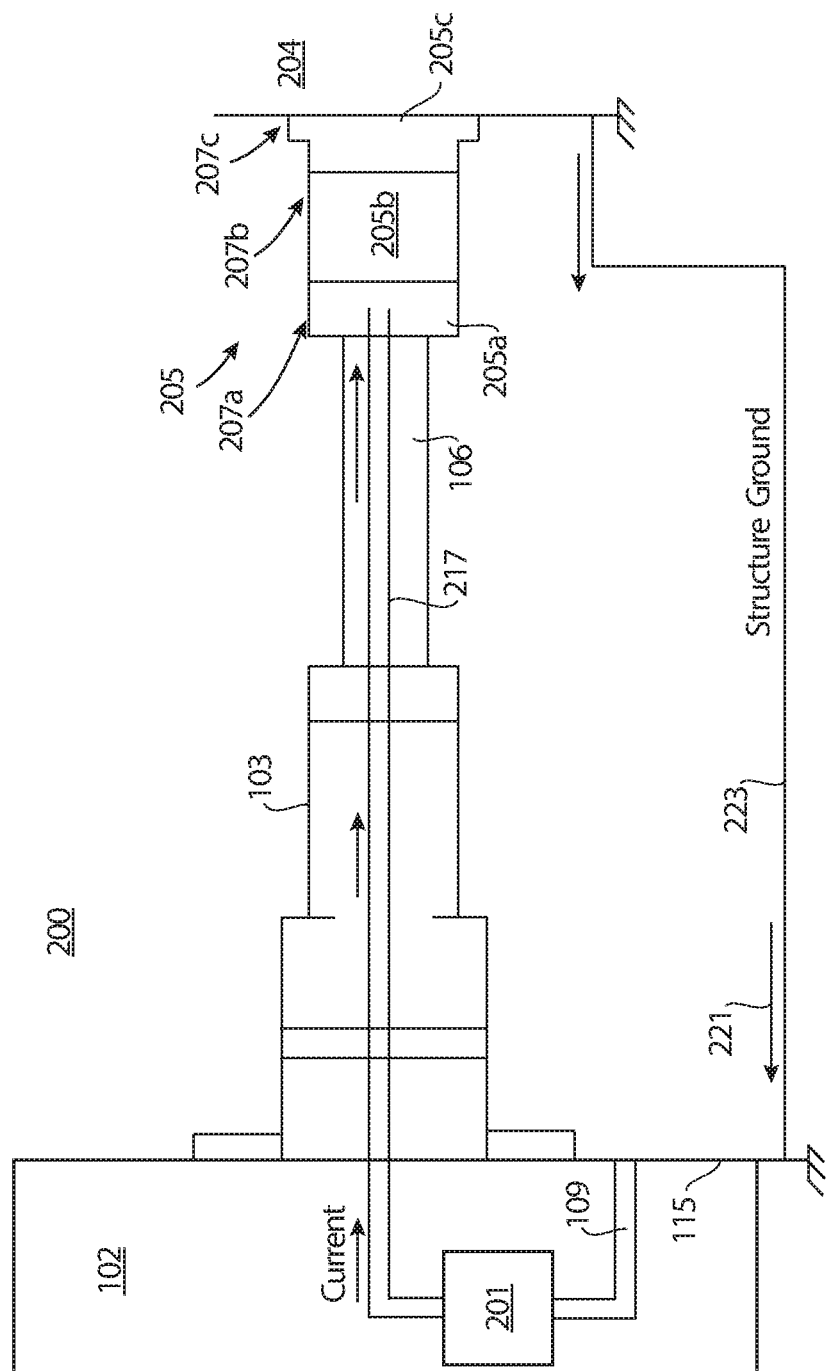
FIG. 2A is a schematic diagram of an embodiment of a system in accordance with this disclosure.
Figure 2B:
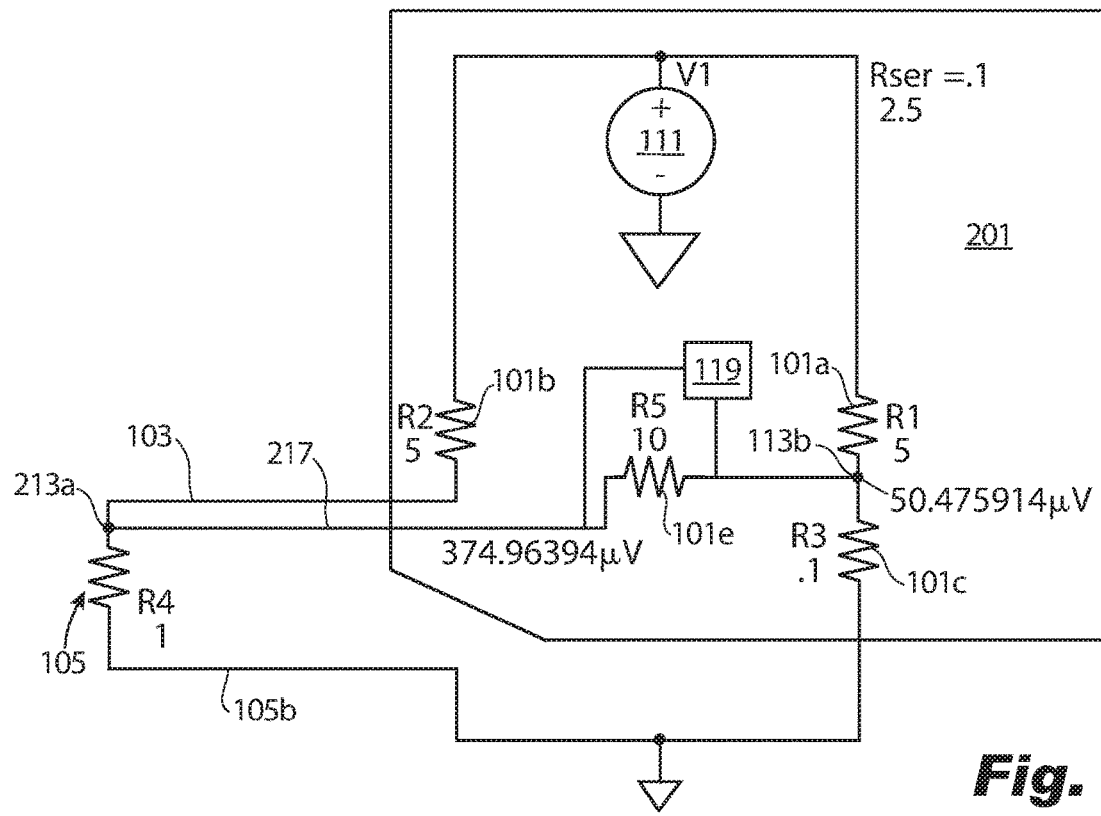
FIG. 2B is a circuit diagram of an embodiment of a circuit formed by the system of FIG. 2A, shown having a higher third wire connection assembly resistance value.

Referring additionally to FIGS. 2A and 2B, in certain embodiments, a system 200 can include a resistance test module 201 that can be similar to the resistance test module 101 described above, but can include a different connection scheme for the fifth resistor 101e. For example, as shown in FIG. 2B, the fifth resistor 101e can be connected to the first test point 213a remotely on the wire connection assembly 205 via a remote sense line 217. In such a case, the first test point 213a is still between the second resistor 101b and the wire connection assembly 205 acting as the fourth resistor 101d of the Wheatstone bridge. The fifth resistor 101e and the other resistors 101a, b, c, e can be connected similarly as described above, for example.

Figure 1B:
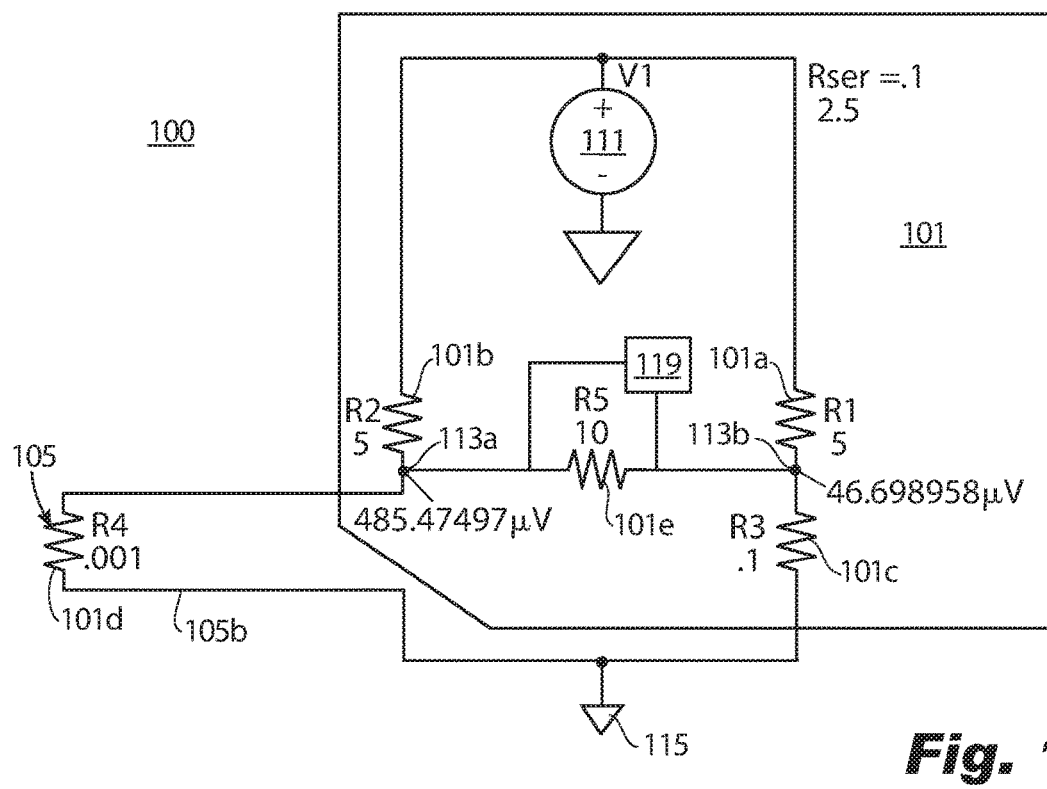
FIG. 1B is a circuit diagram of an embodiment of a circuit formed by the system of FIG. 1A, shown having a first wire connection assembly resistance value.

The resistance test module 101, 201 can include a control module 119 configured to determine a voltage drop across the fifth resistor 101e between the first test point 113a, 213a and the second test point 113b. The control module 119 can be connected across the fifth resistor, e.g., as shown in FIGS. 1B and 2B. The voltage drop over the fifth resistor 101e is a function of the resistance value R4 of the wire connection assembly 105, 205, and thus resistance can be determined, directly or indirectly, as a function of voltage drop across the fifth resistor 101e. This allows determination of a state of the one or more physical connections 107a, b, c, d, 207a, b, c of the wire connection assembly 105, 205 (e.g., whether the connections are corroded or disconnecting).

The control module 119 can include any suitable hardware and/or software configured to determine voltage drop across the fifth resistor 101e. In certain embodiments, the control module 119 can be configured to determine a resistance value R4 of the wire connection assembly 105, 205. In certain embodiments, the control module 119 can be configured to compare the voltage drop to a threshold. In certain embodiments, the control module 119 can be configured to compare the determined resistance value R4 to a threshold.

In certain embodiments the control module 119 can be configured to control the voltage source 111 to turn on and off, and/or to control the amount of voltage output thereby. In this regard, the control module 119 can be configured to control testing of the one or more connections of the wire connection assembly 105, 205. The voltage control module 119 can be configured to perform testing continuously or in accordance with any suitable schedule (e.g., recurring times or intervals) and/or logic (e.g., based on an aircraft startup). The voltage control module 119 can be configured to activate an alarm if a threshold value for voltage drop or resistance R4 is met or exceeded, for example.

The voltage supply 111 can be connected to the control module 119 to turn on and off, and/or can be configured to multiplex with other bridges of other connectors, for example (e.g., such that multiple resistor test modules 101, 201 use a single voltage source). The control module 119 can also be connected to the fifth resistor 101e through an analog-to-digital converter to control an alarm as a function of output of voltage (e.g., to send alarm signal if there is a bad connection). The control module 109 can include a voltage comparator which is configured to activate an alarm (e.g., a light) based on a simple voltage comparison.

In certain embodiments, the system 100, 200 can include the wire connection assembly 105, 205. The one or more physical connections 107a, b, c, d, 207a, b, c can include at least one of a shield termination connection 107a, 207a between a shield 105a, 205a (e.g., a wire mesh of a shielded cable 106) and a back shell 105b, 205b, a back shell connection 107b between a first mating connector 105c (or a bulkhead connector 205c) and the back shell 105b, 205b, a mating connection 107c between a first mating connector 105c and a second mating connector 105d, a chassis connection 107d between a connector flange 105e and a chassis 102, or a bulkhead connection 207c between a bulkhead connector 205c and a bulkhead 204. Any other suitable physical connections and/or portions of wire connection assemblies are contemplated herein.

In certain embodiments, referring to FIG. 1A, a return path 121 can be via only the wire connection assembly 105 in electrical communication with the second line 109 and/or a common ground 115 with the second line 109. In certain embodiments, a return path 221 can be via a separate return line 223 connected to a remote end (e.g., 205c) of the wire connection assembly 205 (e.g., via an electrical path through the bulkhead 204). The separate return line 223 can be in electrical communication with the second line 109 and/or a common ground 115 with the second line 109, e.g., as shown.

In accordance with at least one aspect of this disclosure, a system, e.g., 100, 200, for an aircraft can include a wire connection assembly, e.g., 105, 205, and an integrated resistance test module, e.g., 101, 201 connected to the wire connection assembly and configured to form a Wheatstone bridge with the wire connection assembly. The resistance test module can be configured to determine a quality of the wire connection assembly and/or one or more physical connections thereof.

In accordance with at least one aspect of this disclosure, a method can include using a wire connection assembly as a variable fourth resistor of a Wheatstone bridge to determine a state of one or more physical connections of the wire connection assembly. Using the wire connection assembly can include passing a current through the wire connection assembly to determine a voltage drop over a bridge resistor of the Wheatstone bridge to measure a resistance of the wire connection assembly.

The method can include monitoring the voltage drop in situ to determine if the state of the one or more physical connections of the wire connection assembly are damaged or degraded a predetermined amount. The method can include activating an alert if the voltage drop and/or resistance value reaches or exceeds a predetermined threshold. The predetermined threshold can be a fixed resistance value higher than a normal resistance value for the wire connection assembly, for example.

In accordance with this disclosure, an example of a first wire connection assembly resistance value is shown in FIG. 1B, along with example resistance values for R1, R2, R3, and R5. As appreciated by those having ordinary skill in the art in view of this disclosure, the any suitable resistance values for each resistor is contemplated herein.

Figure 1C:
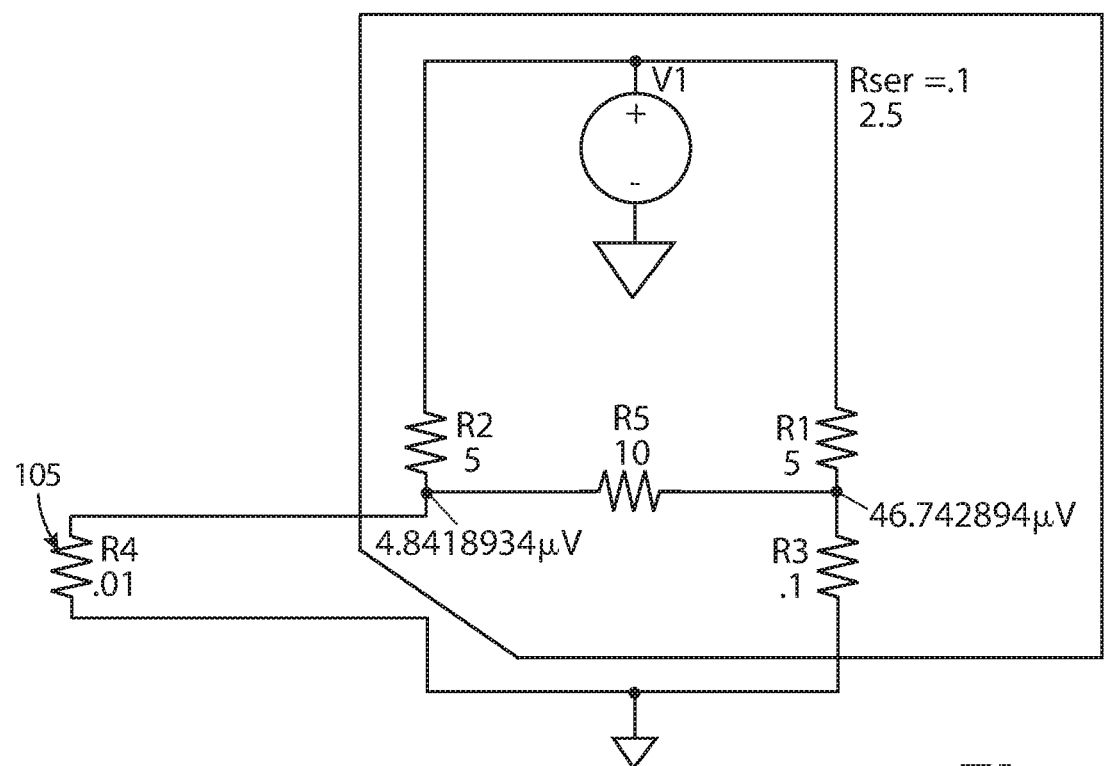
FIG. 1C is a circuit diagram of an embodiment of a circuit formed by the system of FIG. 1A, shown having a higher second wire connection assembly resistance value.
Figure 1D:
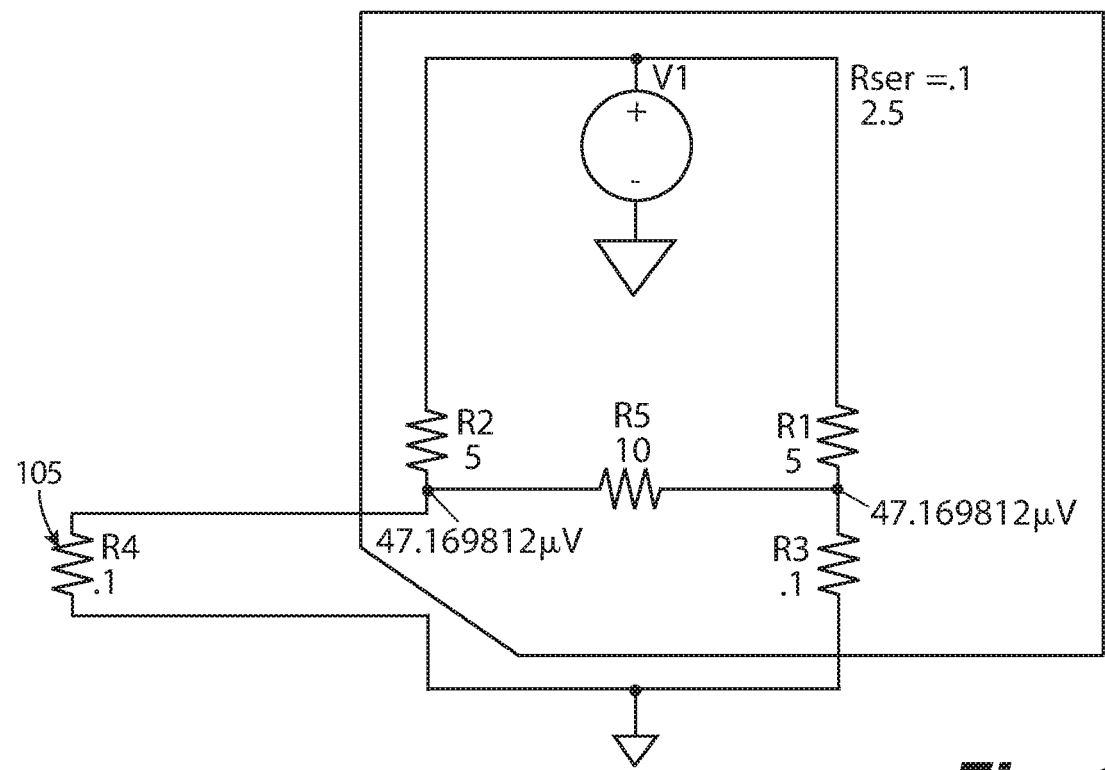
FIG. 1D is a circuit diagram of an embodiment of a circuit formed by the system of FIG. 1A, shown having a higher third wire connection assembly resistance value.

FIG. 1C shows a higher second wire connection assembly resistance value (an order of magnitude below R3), leading to a larger voltage value at first test point 113a and a larger voltage drop across fifth resistor 101e, and indicating degradation of one or more of the physical connections. FIG. 1D shows a continually higher third wire connection assembly resistance value (e.g., equal to R3), leading to an equal voltage at both test points 113a, b and a zero voltage drop, indicating continually increased degradation or breakage. FIG. 2B shows an even higher third wire connection assembly resistance value (e.g., an order of magnitude greater than R3).

As appreciated by those having ordinary skill in the art in view of this disclosure, the resistor values R1, R2, R3, and R5 can be fixed resistance values. The resistors can be sized to handle a desired current (e.g., about 1 amp in certain embodiments) and voltage (e.g., on the order of millivolts as shown). As shown, R1 and R2 can be the same and can be significantly higher than R3 and a normal R4 value to limit current to protect the current source. R5 can be a higher value than R1 and R2, and can be significantly higher than R3 and a normal R4 (e.g., two or more orders of magnitude higher). R3 can be at least an order of magnitude lower than R5. Any other suitable relationship and relative resistances are contemplated herein. The current used can be similar to a typical bond resistance meter to assure accuracy, for example.

Figure 3:
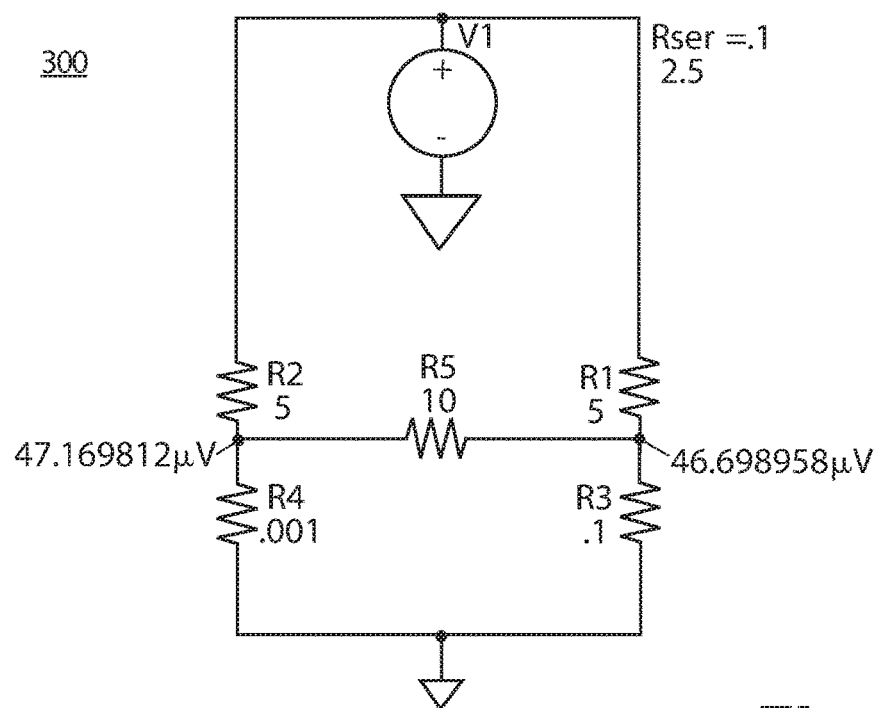
FIG. 3 shows a circuit diagram of an embodiment of a generic Wheatstone bridge in accordance with this disclosure.

An embodiment of a generic Wheatstone bridge 300 circuit diagram for embodiments of this disclosure is shown in FIG. 3. As shown, the values are the same as in FIG. 1B.

In accordance with the above, the fifth resistor 101e can be the output load of the Wheatstone bridge. The third resistor 101c can be the reference bond resistance (e.g., about 0.1 ohms, for example). The resistance value R4 is the measured resistance. In embodiments, the output voltage can be measured with two A/D channels referenced to ground, or across the fifth resistor 101e with a single differential A/D channel, for example. The voltage source can be turned off when the bond resistance test is not in bit mode. In certain embodiments, the output of the bridge changes polarity across the fifth resistor as the external bond resistance value changes above and below the value of the third resistor reference resistance value R3. In certain embodiments, the control module 119 can be a window comparator providing a go-no-go signal. The Wheatstone bridge, e.g., the value of the R3 resistor, can provide a reference bond resistance comparing to the resistance of the measured value across the external mechanical connections, for example.

Certain embodiments split up the bridge to include remote monitoring of a bond resistance. The high side of the fourth resistor/wire connection assembly can pass through a connector under test spare pin and be terminate to an EMI back shell or a braid sock shield termination, for example. The low side of fourth resistor/wire connection assembly can be terminated to the system chassis ground, for example. Test current from the bridge can flow out a spare connector pin connected to the termination of the shields and back to the system chassis. The return current path can be the shield termination to cable connector back shell, cable connector/chassis connector shell interface and the mechanical joint between the chassis connector and the system chassis, for example. Any loose connection in connector hardware or degraded shield termination would result in a higher than normal voltage measurement/resistance value.

When the output voltage is measured differentially across the fifth resistor, a negative voltage can represent a bond resistance lower than the reference resistance and a positive voltage can represent a bond resistance higher than the reference resistance. Embodiments can also be used to monitor bond resistances of external cable connectors like remote bulkhead disconnects by accounting for any resistance in the connecting cable (e.g., assuming a low resistance common structure ground exists). Additional accuracy may need a remote sense lead to be added. In embodiments, software offsets can also be used to account for external current source test conductor losses due to wire resistance.

In embodiments, each connector to be tested can have an electrical circuit as disclosed above and a single differential A/D channel, for example. The voltage source can be common to all circuits and be multiplexed to each circuit in a test sequence, for example. Data from each time bit run can be saved in a database to analyze for long term bond resistance changes, for example. When there is an out of tolerance condition, the user can be directed to the connector having a problem.

Embodiments allow a current path of a bond bit test that can isolate a bond fault to one connector. Embodiments of a current path, e.g., in FIG. 1A, show the bond bit test applies return current through all four joints of a connector assembly. Any higher than normal bond resistance point along the current path would result in a high positive output voltage output from the bridge. Some of the source current may leak down the cable shield but this will not corrupt the measurement unless the cable is very short, for example. Regardless, any leakage can be offset in control module software once it is established, for example.

Embodiments can measure, separately or in addition to the above, the bond resistance of a remote connector with remote sense added for additional accuracy, for example. A third conductor may be required if there is not a common structure ground, for example. The third conductor can be terminated to one of the bulkhead connector flange mounting screws. Any loose connections, for example, in the current path can result in a high voltage at the bridge output. In certain embodiments, conductor losses can be offset in control module software once they are established. Embodiments add current passing through a second connector at other end of wire to sense remotely and to check entire connection as a whole.

Typically, cables for complex devices in aircraft will have interface wire as well as shielding (e.g., metal faraday cage mesh). Over time, the shielding can degrade. Initially, all connections/joints are tested for resistance. Embodiments allow in situ testing, however, by providing current to each of the joints whenever desired, for example (e.g., real time monitoring). Using certain embodiments, it can be determined if the connection as a whole has at least one bad joint (e.g., looseness, corrosion, breakage, etc.) without time consuming manual testing on the ground.

Embodiments include a degraded bond bit test that satisfy the long term monitoring of bond resistance quality without requiring additional maintenance effort. Embodiments can produce long term records that will show any trends in bonding resistance changes. Embodiments can include a Wheatstone bridge with a low voltage DC source, a reference resistance and two voltage measurement points. Embodiments can eliminate the need for additional bond resistance testing in fielded systems by detecting degraded bond resistance in connector/cable assemblies in situ which can eliminate inspection cycles for degraded bond testing.

As will be appreciated by those skilled in the art, aspects of the present disclosure may be embodied as a system, method, or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

Any suitable combination(s) of any disclosed embodiments and/or any suitable portion(s) thereof are contemplated herein as appreciated by those having ordinary skill in the art.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A connection quality system, comprising:
   a resistance test module;
   a first line connected to the resistance test module and configured to connect to a wire connection assembly beyond one or more physical connections of the wire connection assembly; and
   a second line connected to the resistance test module and configured to connect to the wire connection assembly directly or indirectly on an opposite side of the one or more physical connections of the wire connection assembly such that the first line and the second line are in electrical communication through the wire connection assembly,
   wherein the resistance test module is configured to determine if the one or more physical connections are degraded or broken based on a resistance of the wire connection assembly, wherein the resistance test module, the first line, and the second line are configured to form a Wheatstone bridge with the wire connection assembly, wherein the resistance test module includes at least three resistors of the Wheatstone bridge, each having a predetermined resistance, wherein the resistance test module is configured to connect to the wire connection assembly to cause the wire connection assembly to act as a variable fourth resistor of the Wheatstone bridge, wherein the resistance test module is configured to connect to the wire connection assembly to cause the wire connection assembly to act as a variable fourth resistor of the Wheatstone bridge, wherein the at least three resistors of the resistance test module include a first resistor, a second resistor, a third resistor, and a fifth resistor, and wherein the first resistor and the second resistor are connected in parallel to a voltage source, wherein the fifth resistor is connected to a first test point between the second resistor and the first line such that the first test point is between the second resistor and the wire connection assembly acting as the fourth resistor, wherein the fifth resistor is connected to a second test point between the first resistor and the third resistor.

2. The system of claim 1, wherein the third resistor and the fourth resistor are connected in parallel to ground.

3. The system of claim 1, wherein the resistance test module includes a control module configured to determine a voltage drop across the fifth resistor between the first test point and the second test point.

4. The system of claim 1, further comprising the wire connection assembly.

5. The system of claim 4, wherein the one or more physical connections include at least one of a shield termination connection between a shield and a back shell, a back shell connection between a first mating connector and the back shell, a mating connection between a first mating connector and a second mating connector, or a chassis connection between a connector flange and a chassis.

6. The system of claim 4, wherein a return path is via only the wire connection assembly in electrical communication with the second line and/or a common ground with the second line.

7. The system of claim 4, wherein a return path is via a separate return line connected to a remote end of the wire connection assembly, wherein the separate return line is in electrical communication with the second line and/or a common ground with the second line.

8. A system for an aircraft, comprising:
   a wire connection assembly; and
   an integrated resistance test module connected to the wire connection assembly and configured to form a Wheatstone bridge with the wire connection assembly, wherein the resistance test module is configured to determine a quality of the wire connection assembly and/or one or more physical connections thereof;
   a first line connected to the resistance test module and connected to the wire connection assembly beyond one or more physical connections of the wire connection assembly; and
   a second line connected to the resistance test module and connected to the wire connection assembly directly or indirectly on an opposite side of the one or more physical connections of the wire connection assembly such that the first line and the second line are in electrical communication through the wire connection assembly, wherein the resistance test module is configured to determine if the one or more physical connections are degraded or broken based on a resistance of the wire connection assembly, wherein the resistance test module, the first line, and the second line are configured to form a Wheatstone bridge with the wire connection assembly, wherein the resistance test module includes at least three resistors of the Wheatstone bridge, each having a predetermined resistance, wherein the resistance test module connected to the wire connection assembly to cause the wire connection assembly to act as a variable fourth resistor of the Wheatstone bridge, wherein the resistance test module is connected to the wire connection assembly to cause the wire connection assembly to act as a variable fourth resistor of the Wheatstone bridge, wherein the at least three resistors of the resistance test module include a first resistor, a second resistor, a third resistor, and a fifth resistor, and wherein the first resistor and the second resistor are connected in parallel to a voltage source, wherein the fifth resistor is connected to a first test point between the second resistor and the first line such that the first test point is between the second resistor and the wire connection assembly acting as the fourth resistor, wherein the fifth resistor is connected to a second test point between the first resistor and the third resistor.

9. A connection quality system, comprising:
a resistance test module;
a first line connected to the resistance test module and configured to connect to a wire connection assembly beyond one or more physical connections of the wire connection assembly; and
a second line connected to the resistance test module and configured to connect to the wire connection assembly directly or indirectly on an opposite side of the one or more physical connections of the wire connection assembly such that the first line and the second line are in electrical communication through the wire connection assembly,
wherein the resistance test module is configured to determine if the one or more physical connections are degraded or broken based on a resistance of the wire connection assembly, wherein the resistance test module, the first line, and the second line are configured to form a Wheatstone bridge with the wire connection assembly, wherein the resistance test module includes at least three resistors of the Wheatstone bridge, each having a predetermined resistance, wherein the resistance test module is configured to connect to the wire connection assembly to cause the wire connection assembly to act as a variable fourth resistor of the Wheatstone bridge, wherein the resistance test module is configured to connect to the wire connection assembly to cause the wire connection assembly to act as a variable fourth resistor of the Wheatstone bridge, wherein the at least three resistors of the resistance test module include a first resistor, a second resistor, a third resistor, and a fifth resistor, and wherein the first resistor and the second resistor are connected in parallel to the voltage source, wherein the fifth resistor is connected to a first test point on the wire connection assembly via a remote sense line such that the first test point is between the second resistor and the wire connection assembly acting as the fourth resistor, wherein the fifth resistor is connected to a second test point between the first resistor and the third resistor.

\* \* \* \* \*